(12) United States Patent
Yamane

(10) Patent No.: US 7,728,640 B2
(45) Date of Patent: Jun. 1, 2010

(54) DLL CIRCUIT

(75) Inventor: Fumiyuki Yamane, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 12/113,612

(22) Filed: May 1, 2008

(65) Prior Publication Data
US 2008/0309387 A1    Dec. 18, 2008

(30) Foreign Application Priority Data
Jun. 15, 2007    (JP) .............................. 2007-158639

(51) Int. Cl.
*H03L 7/00* (2006.01)
(52) U.S. Cl. ....................... 327/161; 327/158
(58) Field of Classification Search .................. None
See application file for complete search history.

(56) References Cited

U.S. PATENT DOCUMENTS

| | | | | |
|---|---|---|---|---|
| 6,646,480 | B2 * | 11/2003 | Weng et al. | 327/99 |
| 6,784,714 | B2 * | 8/2004 | Nakamura | 327/271 |
| 6,998,897 | B2 * | 2/2006 | Pilo et al. | 327/276 |
| 7,049,868 | B2 * | 5/2006 | Lutkemeyer | 327/161 |
| 7,310,010 | B2 * | 12/2007 | Minzoni et al. | 327/175 |
| 2003/0006808 | A1 * | 1/2003 | Weng et al. | 327/99 |
| 2005/0184776 | A1 * | 8/2005 | Pilo et al. | 327/158 |

FOREIGN PATENT DOCUMENTS

JP    11-272355    10/1999

* cited by examiner

*Primary Examiner*—Cassandra Cox
(74) *Attorney, Agent, or Firm*—Oblon, Spivak, McClelland, Maier & Neustadt, L.L.P.

(57) ABSTRACT

A DLL circuit according to an embodiment of the present invention includes: a delay line configured to output a plurality of delayed signals of a reference signal, the delay line including, a plurality of first delay units connected in series with each other, each of the first delay units being configured to output a delayed signal of the reference signal, a blocking circuit inserted between the first delay units, the blocking circuit being capable of switching between passing and blocking an input delayed signal of the reference signal, and the delay time of the blocking circuit being integer times as large as each of the delay time of the first delay units, and one or more second delay units connected in parallel with the blocking circuit, the same signal as the delayed signal that is input in the blocking circuit being input in the second delay units, each of the second delay units being configured to output a delayed signal of the reference signal, and the delay time of each of the second delay units being equal to the delay time of each of the first delay units; and a blocking control circuit configured to control the blocking circuit whether to pass or block the delayed signal that is input in the blocking circuit.

20 Claims, 10 Drawing Sheets

DLL CIRCUIT

CROSS REFERENCE TO RELATED APPLICATIONS

This application is based upon and claims the benefit of priority from the prior Japanese Patent Application No. 2007-158639, filed on Jun. 15, 2007, the entire contents of which are incorporated herein by reference.

BACKGROUND OF THE INVENTION

1. Field of the Invention

The present invention relates to a DLL (Delay-Locked Loop) circuit.

2. Background Art

A DLL circuit can control the delay of a signal. The DLL circuit is used, for example, for delaying the internal clock of a circuit device to synchronize the internal clock to an external clock of the circuit device. The performance of the DLL circuit can considerably affect the performance of a high-speed memory such as a DDR (Double Data Rate) memory.

Typically, the DLL circuit is provided with a delay line which includes plural delay units connected in series with each other. In the delay line, a reference signal propagates from a delay unit in an earlier stage to a delay unit in a later stage, and each delay unit outputs a delayed signal of the reference signal. The DLL circuit can decrease the delay of the reference signal, by employing a delayed signal output from a delay unit in an earlier stage. On the other hand, the DLL circuit can increase the delay of the reference signal, by employing a delayed signal output from a delay unit in a later stage. Hereinafter, a delay unit in an earlier stage is referred to as an earlier delay unit, and a delay unit in a later stage is referred to as a later delay unit.

Such a DLL circuit has a problem that considerable electric power is wasted on the delay line. In the DLL circuit, even when a delayed signal output from an earlier delay unit is used, the reference signal propagates to a later delay unit. In other words, the reference signal propagates to delay units located after a delay unit that outputs a delayed signal to be used, although they do not need the supply of the reference signal. Consequently, delay units that do not need to operate uselessly operate to waste power.

Therefore, an idea has been proposed that provides a blocking circuit in the delay line. The blocking circuit can switch between passing a reference signal (delayed signal) from a preceding stage to a subsequent stage and blocking the reference signal (delayed signal). In this case, the DLL circuit is provided with a delay line including plural delay units connected in series with each other and a blocking circuit inserted between those delay units.

In such a DLL circuit, wasted power consumption on the delay line is reduced. However, in this case, the delay time of each delay unit must be made equal to the delay time of the blocking circuit in order to enable the blocking circuit to serve as a delay unit. To make the delay time of each delay unit equal to that of the blocking circuit, the delay time of each delay unit must be increased, or the delay time of the blocking circuit must be decreased. The blocking circuit includes a circuit element for implementing the blocking function. Therefore, the delay time of the blocking circuit that has both blocking function and delaying function usually cannot be reduced to a value equal to the delay time of a delay unit that has only the delaying function. Accordingly, to make the delay time of each delay unit equal to that of the blocking circuit, in general, the delay time of each delay unit must be increased.

The equalized delay time is the minimum unit of delay time that the delay line can adjust. In other words, the delay time adjusted by the delay line has an error equal to the equalized delay time at maximum. This causes jitter in the DLL circuit that includes plural delay units and the blocking circuit. Therefore, the DLL circuit has a problem that jitter increases while wasted power consumption on the delay line is reduced. This is because the delay time of each delay unit needs to be increased in order to make the delay time of each delay unit equal to that of the blocking circuit in the DLL circuit, which increases the minimum unit of delay time that the delay line can adjust. A large jitter is a problem when handling an RF signal, in particular.

JP-A H11-272355 (KOKAI) discloses a clock synchronization delay control circuit and a clock synchronization delay control method that prevent wasteful consumption of electric power.

SUMMARY OF THE INVENTION

An embodiment of the present invention is, for example, a DLL circuit including: a delay line configured to output a plurality of delayed signals of a reference signal, the delay line including, a plurality of first delay units connected in series with each other, each of the first delay units being configured to output a delayed signal of the reference signal, a blocking circuit inserted between the first delay units, the blocking circuit being capable of switching between passing and blocking an input delayed signal of the reference signal, and the delay time of the blocking circuit being integer times as large as each of the delay time of the first delay units, and one or more second delay units connected in parallel with the blocking circuit, the same signal as the delayed signal that is input in the blocking circuit being input in the second delay units, each of the second delay units being configured to output a delayed signal of the reference signal, and the delay time of each of the second delay units being equal to the delay time of each of the first delay units; and a blocking control circuit configured to control the blocking circuit whether to pass or block the delayed signal that is input in the blocking circuit.

Another embodiment of the present invention is, for example, a DLL circuit including: an input circuit configured to generate, from a DLL input signal, a reference signal to be used for phase comparison; a delay line configured to output a plurality of delayed signals of the reference signal, the delay line including, a plurality of first delay units connected in series with each other, each of the first delay units being configured to output a delayed signal of the reference signal, a blocking circuit inserted between the first delay units, the blocking circuit being capable of switching between passing and blocking an input delayed signal of the reference signal, and the delay time of the blocking circuit being integer times as large as each of the delay time of the first delay units, and one or more second delay units connected in parallel with the blocking circuit, the same signal as the delayed signal that is input in the blocking circuit being input in the second delay units, each of the second delay units being configured to output a delayed signal of the reference signal, and the delay time of each of the second delay units being equal to the delay time of each of the first delay units; a selector configured to select, from the plurality of delayed signals of the reference signal, a delayed signal to be used as a DLL output signal; a timing offset circuit configured to adjust the phase of the selected delayed signal to generate a compared signal whose phase is to be compared with the phase of the reference signal; a phase comparator configured to compare the phase of the compared signal with the phase of the reference signal to output a phase comparison result; a control circuit configured to generate, based on the phase comparison result, a control signal for the selector; and a blocking control circuit configured to control, based on the control signal, whether the blocking circuit to pass or block the delayed signal that is input in the blocking circuit.

Another embodiment of the present invention is, for example, a DLL circuit including: a delay line configured to output a plurality of delayed signals of a reference signal, the delay line including, a plurality of first delay units connected in series with each other, each of the first delay units being configured to output a delayed signal of the reference signal, a plurality of blocking circuits, each of the blocking circuits being inserted between the first delay units, each of the blocking circuits being capable of switching between passing and blocking an input delayed signal of the reference signal, and the delay time of each of the blocking circuits being integer times as large as the delay time of each of the first delay units, and a plurality of second delay units, each of the second delay units being connected in parallel with any of the blocking circuits, the same signal as the delayed signals that are input in the blocking circuits being input in the second delay units, each of the second delay units being configured to output a delayed signal of the reference signal, and the delay time of each of the second delay units being equal to the delay time of each of the first delay units; and a blocking control circuit configured to control the blocking circuits whether to pass or block the delayed signals that are input in the blocking circuits.

DESCRIPTION OF THE EMBODIMENTS

Figure 1:
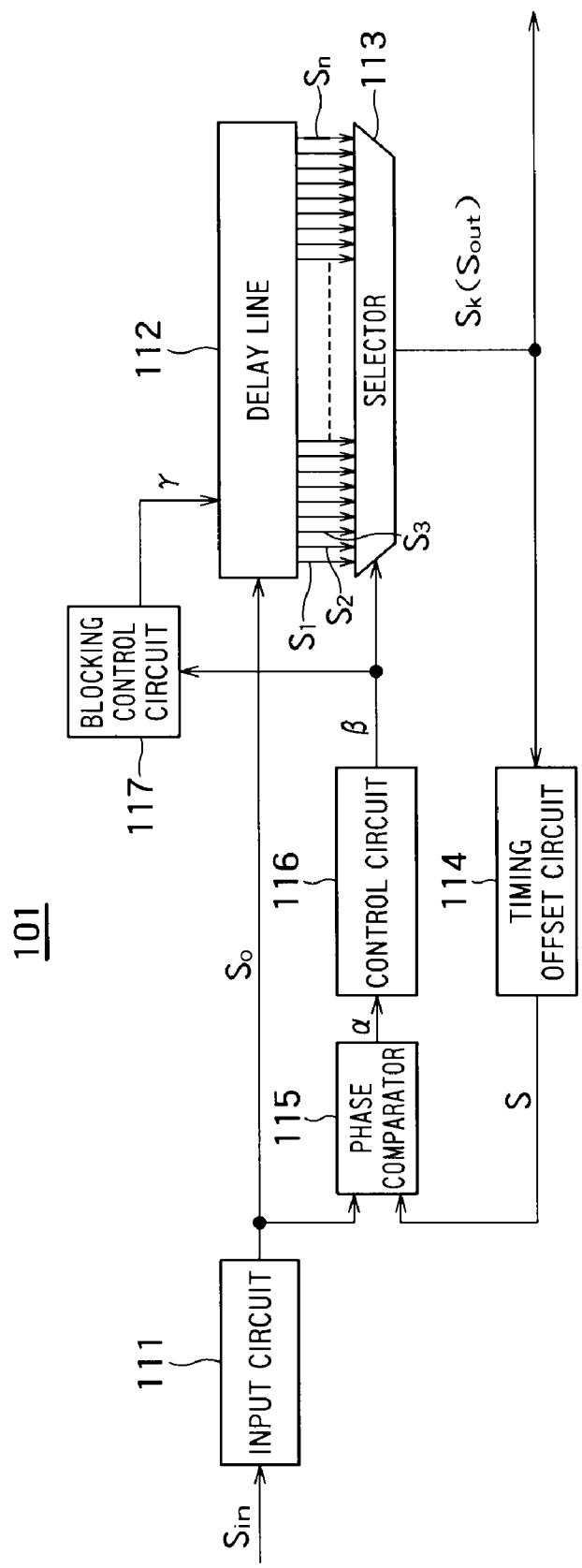
FIG. 1 shows a circuit configuration of a DLL circuit according to an embodiment of the present invention.

FIG. 1 shows a circuit configuration of a DLL circuit 101 according to an embodiment of the present invention. The DLL circuit 101 includes an input circuit 111, a delay line 112, a selector 113, a timing offset circuit 114, a phase comparator 115, a control circuit 116, and a blocking control circuit 117. The DLL circuit 101 may be implemented by a single chip or plural chips. The DLL circuit 101 can be used as a DLL circuit for a DDR memory, for example.

The input circuit 111 is configured to generate, from a DLL input signal $S_{in}$, a reference signal $S_0$ to be used for phase comparison.

The delay line 112 is configured to output plural delayed signals of the reference signal $S_0$. Such plural delayed signals $S_1, S_2, S_3, \ldots, S_n$ are shown in FIG. 1.

Figure 2:
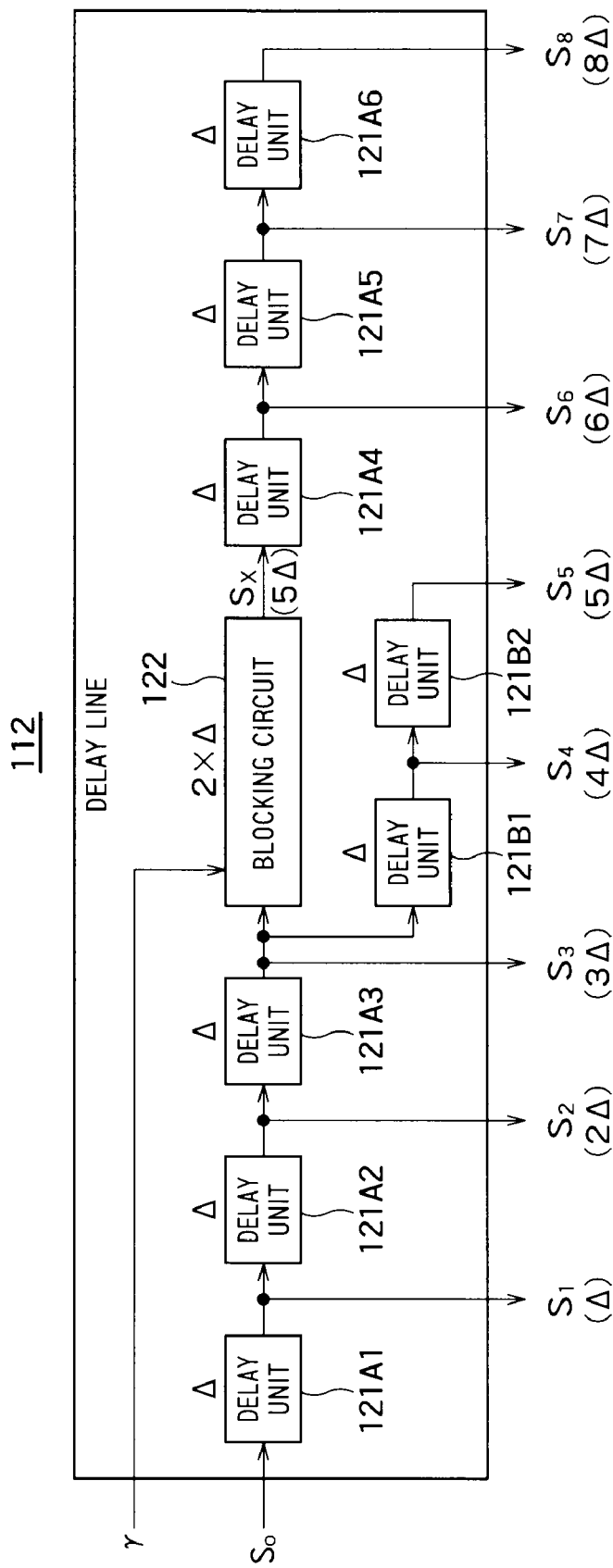
FIG. 2 shows a circuit configuration of a delay line shown in FIG. 1.

FIG. 2 shows a circuit configuration of the delay line 112 in FIG. 1. The delay line 112 includes six delay units 121A1 to 121A6 connected in series with each other, a blocking circuit 122 inserted between the delay units 121A1 to 121A6, and two delay units 121B1 and 121B2 connected in parallel with the blocking circuit 122. The delay units 121A1 to 121A3 are located before the blocking circuit 122, and the delay units 121A4 to 121A6 are located after the blocking circuit 122. The delay units 121B1 and 121B2 are connected in series with each other and are located after the delay units 121A1 to 121A3. Each of the delay units 121A1 to 121A6 (referred to as "delay units 121A") is an example of a first delay unit. Each of the delay units 121B1 and 121B2 (referred to as "delay units 121B") is an example of a second delay unit.

While the delay line 112 includes eight delay units 121 here, the delay line 112 may include more or less delay units 121. The number of delay units included in the delay line 112 may be about 250, for example. Each of the delay units 121 outputs a delayed signal of the reference signal $S_0$, in such a manner that each delay unit 121 outputs a delayed signal of a signal input from the preceding delay unit 121 to the subsequent delay unit 121. In this way, the reference signal (delayed signal) propagates from an earlier delay unit 121 to a later delay unit 121 in the delay line 112, and plural delayed signals $S_1, S_2, S_3, \ldots, S_8$ are output from the delay line 112.

While six delay units 121A are connected in series with each other here, more or less delay units 121A may be connected. While two delay units 121B are connected in parallel with the blocking circuit 122 here, more or less delay units 121B may be connected. In this embodiment, the delay line 112 may be provided with plural delay units 121A connected in series with each other, a blocking circuit 122 inserted between the plural delay units 121A, and one or more delay units 121B connected in parallel with the blocking circuit 122. The one or more delay units 121B are connected in series with each other, when the one or more delay units 121B include plural delay units 121B. Plural delayed signals $S_1, S_2, S_3, \ldots, S_n$ are output from the delay line 112.

The blocking circuit 122 is capable of switching between passing an input signal (delayed signal of the reference signal $S_0$) from the preceding stage to the subsequent stage and blocking the input signal. In passing, the blocking circuit 122 outputs a delayed signal of the reference signal $S_0$, in such a manner that a delayed signal of a signal input from the preceding stage is output to the subsequent stage. As a result, a signal input from the delay unit 121A3 propagates to the delay unit 121A4. In blocking, the blocking circuit 122 blocks a signal input from the preceding stage. As a result, a signal input from the delay unit 121A3 is blocked. Because the delay units 121B1 and 121B2 are connected in parallel with the blocking circuit 122, the same signal that is input in the blocking circuit 122 (delayed signal of the reference signal $S_0$) is input in the delay units 121B1 and 121B2 (more specifically, in the delay unit 121B1).

Figure 3:
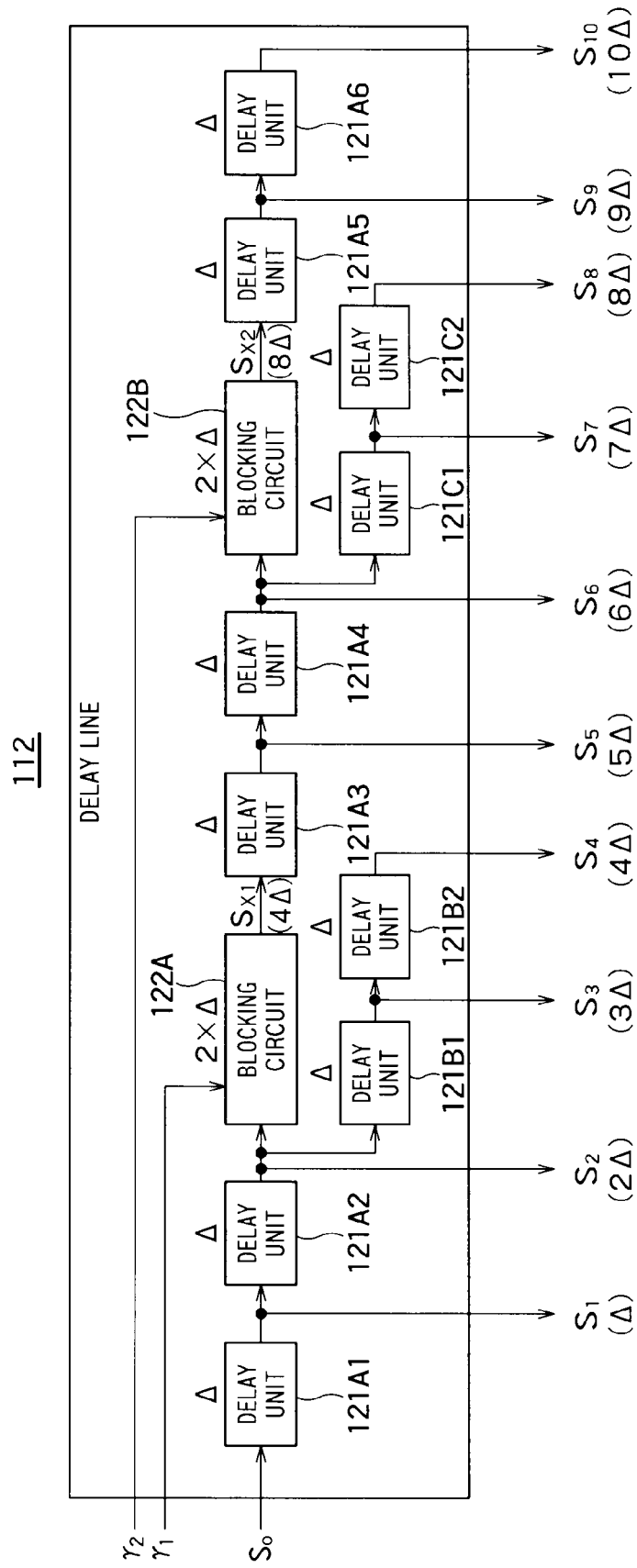
FIG. 3 shows a circuit configuration of a delay line shown in FIG. 1 (variation)

While the delay line 112 described above includes a single blocking circuit 122, the delay line 112 may include plural blocking circuits 122. An example of such a delay line 112 is shown in FIG. 3. The delay line 112 includes plural delay units 121A1 to 121A6 connected in series with each other, plural blocking circuits 122A and 122B, each of which is inserted between the plural delay units 121A1 to 121A6, one or more delay units 121B1 and 121B2 connected in parallel with the blocking circuit 122A, and one or more delay units 121C1 and 121C2 connected in parallel with the blocking circuit 122B. The one or more delay units 121B (delay units 121B1 and 121B2 here) are connected in series with each other, when the one ore more delay units 121B include plural delay units 121B. The one or more delay units 121C (delay units 121C1 and 121C2 here) are connected in series with each other, when the one ore more delay units 121C include plural delay units 121C. If the delay unit 112 is provided with N blocking circuits 122, N sets of delay units 121 are connected in parallel with the blocking circuits 122 (N is a positive integer).

Each of the delay units 121A1 to 121A6 is an example of a first delay unit. Each of the delay units 121B1, 121B2, 121C1, and 121C2 is an example of a second delay unit. Because the delay units 121B1 and 121B2 are connected in parallel with the blocking circuit 122A, the same signal that is input in the blocking circuit 122A (delayed signal of the reference signal $S_0$) is input in the delay units 121B1 and 121B2 (more specifically, the delay unit 121B1). Because the delay units 121C1 and 121C2 are connected in parallel with the blocking circuit 122B, the same signal that is input in the blocking circuit 122B (delayed signal of the reference signal $S_0$) is input in the delay units 121C1 and 121C2 (more specifically, the delay unit 121C1).

Returning to FIG. 2, the description will be continued.

In this embodiment, the delay time of each of the delay units 121 that constitute the delay line 112 is $\Delta$, and the delay time of the blocking circuit 122 is $2*\Delta$. That is, the delay time of the blocking circuit 122 is twice as large as the delay time of each of the delay units 121 constituting the delay line 112. Accordingly, the delay times of delayed signals $S_1$, $S_2$, and $S_3$ output from the delay units 121A1, 121A2, and 121A3 are $\Delta$, $2\Delta$, and $3\Delta$, respectively. The delay times of delayed signals $S_4$ and $S_5$ output from the delay units 121B1 and 121B2 are $4\Delta$ and $5\Delta$, respectively. The delay times of delayed signals $S_6$, $S_7$, and $S_8$ output from the delay units 121A4, 121A5, and 121A6 are $6\Delta$, $7\Delta$, and $8\Delta$, respectively. The delay time of delayed signal $S_x$ output from the blocking circuit 122 is $5\Delta$.

The delay time of the blocking circuit 122 may be integer times as large as the delay time of each delay unit 121 constituting the delay line 112. If the delay time of the blocking circuit 122 is $M*\Delta$, M delay units 121B1 to 121BM are connected in parallel with the blocking circuit 122 as the second delay units, and the delay units 121B1 to 121BM are connected in series with each other (M is a positive integer). This makes the delay time of the blocking circuit 122 equal to the total of the delay times of the delay units 121B1 to 121BM. On the other hand, the delay time of each second delay unit is equal to the delay time of each first delay unit in this embodiment, as described above.

Figure 4:
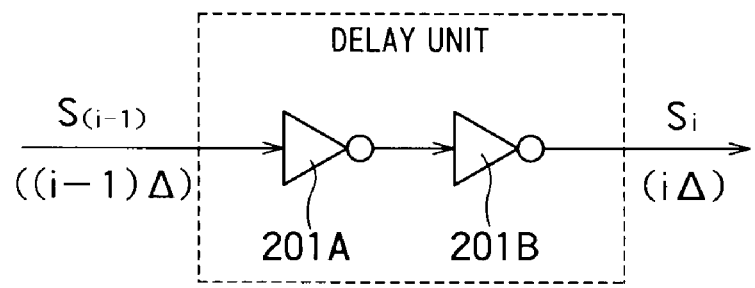
FIG. 4 shows a circuit configuration of each delay unit shown in FIG. 2.

FIG. 4 shows an exemplary circuit configuration of each delay unit 121 shown in FIG. 2. The delay unit 121 shown in FIG. 4 includes two inverters 201A and 201B connected in series with each other. In FIG. 4, a signal $S_{(i-1)}$ is input in the delay unit 121 and a signal $S_i$ is output from the delay unit 121 (where i=a number from 1 to 8 and $S_{(i-1)=5}=S_x$). The circuit configuration of each delay unit 121 in FIG. 2 is not limited to that shown in FIG. 4. For example, each delay unit 121 in FIG. 2 may include an even number of inverters 201 connected in series with each other.

Figure 5:
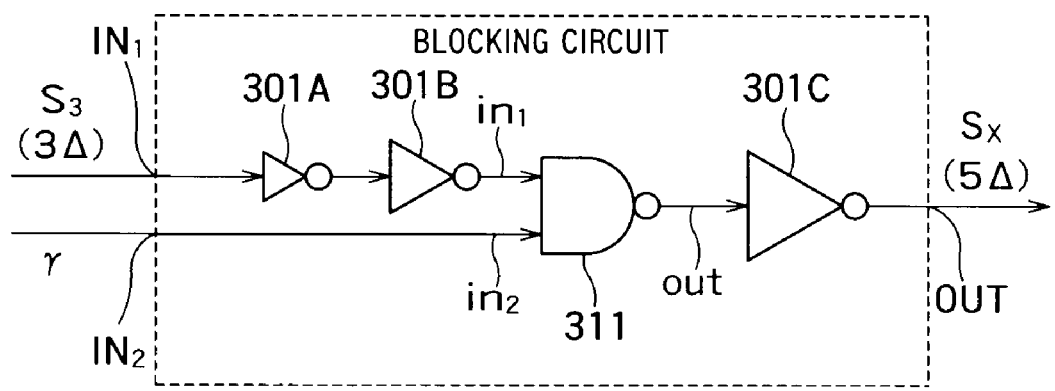
FIG. 5 shows a circuit configuration of a blocking circuit shown in FIG. 2.

FIG. 5 shows an exemplary circuit configuration of the blocking circuit 122 shown in FIG. 2. The blocking circuit 122 shown in FIG. 5 includes three inverters 301A to 301C connected in series with each other, and a NAND circuit 311 connected in series with the inverters 301A to 301C. In FIG. 5, a delayed signal $S_3$ is input in a first input "$IN_1$," of the blocking circuit 122, a blocking control signal γ (which will be described later) is input in a second input "$IN_2$" of the blocking circuit 122, and a delayed signal $S_x$ is output from an output "OUT" of the blocking circuit 122. The circuit configuration of the blocking circuit 122 in FIG. 2 is not limited to that shown in FIG. 5. For example, the blocking circuit 122 in FIG. 2 may include an odd number of inverters 301 connected in series with each other, and a NAND circuit 311 connected in series with the odd number of inverters 301.

The first input "$IN_1$", the second input "$IN_2$", and the output "OUT" of the blocking circuit 122 in FIG. 5 are electrically connected to a first input "$in_1$", a second input "$in_2$", and an output "out" of the NAND circuit 311, respectively. The inverters 301A and 301B are located before the NAND circuit 311 and inserted between the first inputs "$IN_1$" and "$in_1$". The inverter 301C is located after the NAND circuit 311 and inserted between the outputs "OUT" and "out". While the blocking circuit 122 in FIG. 5 includes the NAND circuit 311 in which the delayed signal $S_3$ and blocking control signal γ are input, the blocking circuit 122 may include an AND circuit in which the delayed signal $S_3$ and blocking control signal γ are input. Such a blocking circuit 122 is provided with an even number of inverters 301 connected in series with each other, where the AND circuit is connected in series with the even number of inverters 301.

Returning to FIG. 1, the description will be continued.

The selector 113 is configured to select a delayed signal from the plural delayed signals $S_1$, $S_2$, $S_3$, ..., $S_n$ and output the selected delayed signal. FIG. 1 shows a delayed signal $S_k$ which is selected and output. When the DLL circuit 101 is locked, the delayed signal $S_k$ is a DLL output signal $S_{out}$.

The timing offset circuit 114 is configured to adjust the phase of the delayed signal $S_k$ to generate a compared signal S whose phase is to be compared with the phase of the reference signal $S_0$.

The phase comparator 115 is configured to compare the phase of the compared signal S with the phase of the reference signal $S_0$ and output the result of the phase comparison between these signals. FIG. 1 shows an output signal α including the result of the phase comparison.

The control circuit 116 is configured to generate, based on the result of the phase comparison (i.e., based on the output signal α), a control signal β for the selector 113. When the delay of the compared signal S is excessively large, the control circuit 116 generates a control signal β that causes the selector 113 to select a delayed signal with a smaller delay. When the delay of the compared signal S is excessively small, the control circuit 116 generates a control signal β that causes the selector 113 to select a delayed signal with a larger delay.

The blocking control circuit 117 is configured to control, based on the control signal β, whether the blocking circuit 122 to pass or block the delayed signal $S_3$. The blocking circuit 122 has been described above and shown in FIG. 2.

Whether or not to cause the blocking circuit 122 to pass the delayed signal $S_3$, is controlled based on whether the delayed signal to be selected is a delay signal output from a stage subsequent to the blocking circuit 122 or not. The delayed signal to be selected can be identified from the control signal β for the selector 113. In this embodiment, delayed signals output from stages subsequent to the blocking circuit 122 are the delayed signals $S_6$, $S_7$, and $S_8$.

When a delayed signal output from a stage subsequent to the blocking circuit 122 is used (i.e., selected), the blocking control circuit 117 causes the blocking circuit 122 to pass the delayed signal $S_3$. That is, when the signal $S_6$, $S_7$, or $S_8$ is used, the blocking circuit 122 passes (i.e., does not block) the delayed signal $S_3$. Because the signal $S_3$ is delayed in the blocking circuit 122 and is output as $S_x$, the delayed signal $S_3$ input from the preceding stage is propagated as a delayed signal $S_x$ to the subsequent stage.

On the other hand, when the delayed signal output from a stage subsequent to the blocking circuit 122 is not used (i.e., not selected), the blocking control circuit 117 causes the blocking circuit 122 to block the delayed signal $S_3$. That is, when the signal $S_1$, $S_2$, $S_3$, $S_4$, or $S_5$ is used, the blocking circuit 122 blocks (i.e., does not pass) the delayed signal $S_3$. In this case, the delayed signals $S_1$, $S_2$, $S_3$, $S_4$, and $S_5$ are output from the delay line 112.

The blocking control circuit 117 generates a blocking control signal γ for controlling the blocking circuit 122. The blocking control signal γ is output from the blocking control circuit 117, and input in the blocking circuit 122 as described above. The blocking control circuit 117 controls whether the blocking circuit 122 to pass or block the delayed signal $S_3$, by generating and outputting the blocking control signal γ. When a signal $S_6$, $S_7$, or $S_8$ is used, the blocking control circuit 117 generates and outputs a blocking control signal γ that instructs to pass the delayed signal $S_3$. When a delayed signal other than signals $S_6$, $S_7$, and $S_8$ is used, the blocking control circuit 117 generates and outputs a blocking control signal γ that instructs to block the delayed signal $S_3$.

Operation of the DLL circuit 101 in FIG. 1 is as follows.

In the DLL circuit 101, the phase comparator 115 compares the phase of a compared signal S with the phase of a reference signal $S_0$, and outputs a signal α that indicates the result of the phase comparison. Then, the control circuit 116 generates a control signal β for the selector 113, based on the signal α. Then, the blocking control circuit 117 generates a blocking control signal γ for controlling the blocking circuit 122, based on the control signal β. When a signal $S_6$, $S_7$, or $S_8$ is to be used, a blocking control signal γ that instructs to pass the delayed signal $S_3$ is generated. When a delayed signal other than signals $S_6$, $S_7$, and $S_8$ is to be used, a blocking control signal γ that instructs to block the delayed signal $S_3$ is generated.

When the delay line 112 receives a blocking control signal γ that instructs to pass the delayed signal $S_3$, the delay line 112 outputs delayed signals $S_1$ to $S_8$. When the delay line 112 receives a blocking control signal γ that instructs to block the delayed signal $S_3$, the delay line 112 outputs delayed signal $S_1$ to $S_5$ but does not output delayed signals $S_6$ to $S_8$. In the former case, the selector 113 selects a delayed signal $S_k$ from the plural delayed signals $S_1$ to $S_8$. In the latter case, the selector 113 selects a delayed signal $S_k$ from the plural delayed signals $S_1$ to $S_5$. The timing offset circuit 114 adjusts the phase of the delayed signal $S_k$ to generate a compared signal S.

The DLL circuit 101 repeats the operation described above until it is determined that the difference between the phase of the reference signal $S_0$ and the phase of the compared signal S is 0 (or less than a threshold). As a result, the phase of the compared signal S is synchronized to the phase of the reference signal $S_0$, i.e., the DLL circuit 101 is locked. In this way, the DLL input signal $S_{in}$ input in the DLL circuit 101 is output from the DLL circuit 101 as a DLL output signal $S_{out}$.

First and second comparative examples will be described below. The description of the first and second comparative examples will focus on differences from the present embodiment.

Figure 6A:
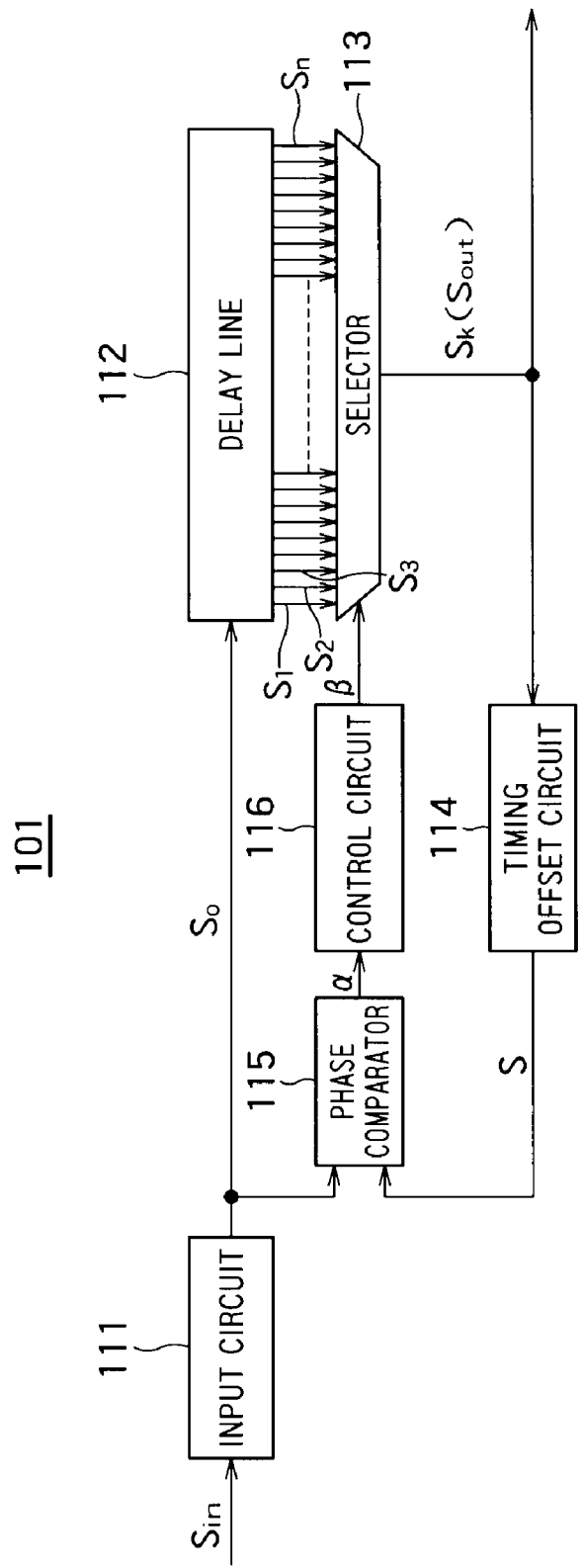
FIG. 6A shows a circuit configuration of a DLL circuit in a first comparative example.
Figure 6B:
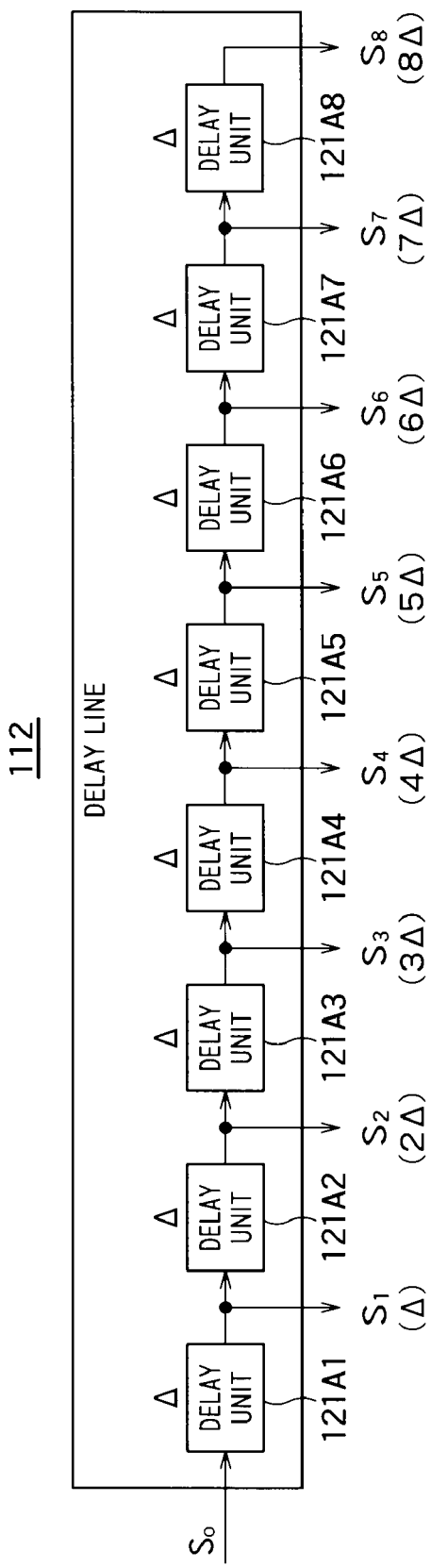
FIG. 6B shows a circuit configuration of a delay line shown in FIG. 6A.

FIG. 6A shows a circuit configuration of a DLL circuit 101 in the first comparative example. The DLL circuit 101 includes an input circuit 111, a delay line 112, a selector 113, a timing offset circuit 114, a phase comparator 115, and a control circuit 116. FIG. 6B shows a circuit configuration of the delay line 112 shown in FIG. 6A. The delay line 112 includes eight delay units 121A1 to 121A8 connected in series with each other.

Figure 6C:
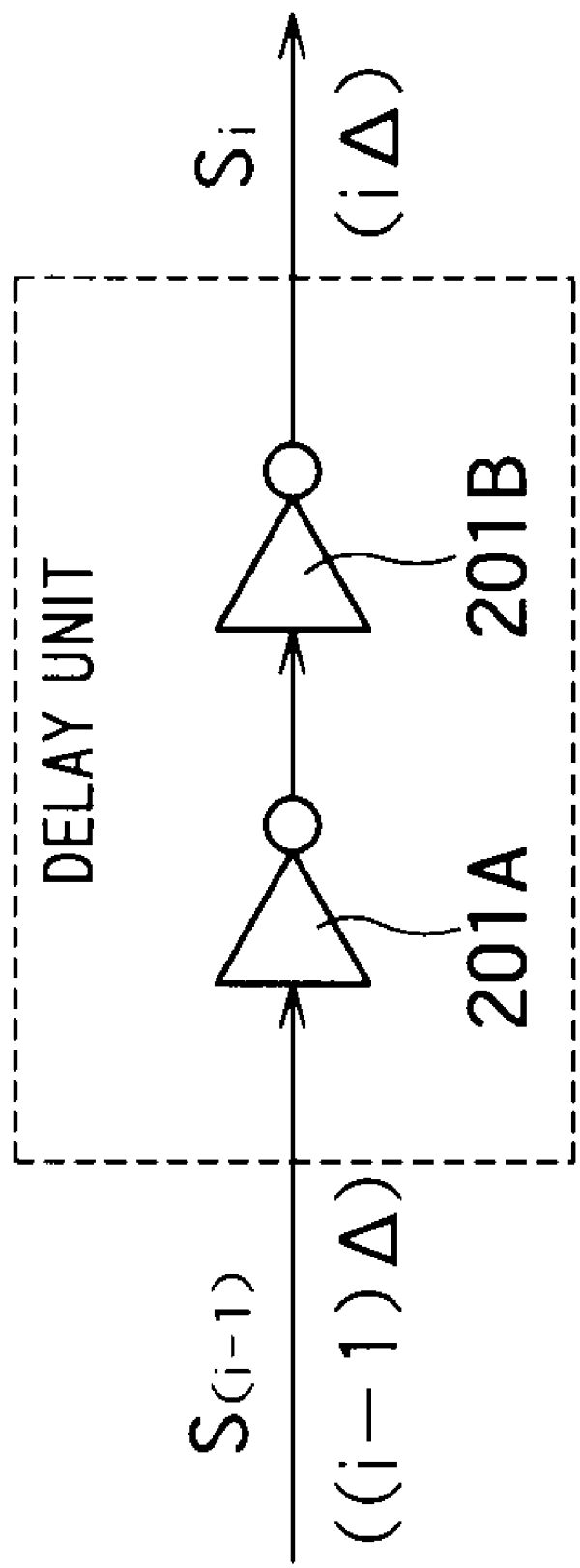
FIG. 6C shows a circuit configuration of each delay unit shown in FIG. 6B.

FIG. 6C shows a circuit configuration of each delay unit 121 shown in FIG. 6B. The delay unit 121 in FIG. 6C includes two inverters 201A and 201B connected in series with each other.

In the first comparative example, the delay time of each of the delay units 121 constituting the delay line 112 is Δ. Accordingly, the amount of jitter in the DLL circuit 101 in the first comparative example is about the same as that in the DLL circuit 101 of the present embodiment. On the other hand, in the first comparative example, even when a delayed signal from an earlier delay unit 121 is used, the reference signal propagates to a later delay unit 121. This is because the blocking circuit 122 and blocking control circuit 117 are not provided in the DLL circuit 101 in the first comparative example. Therefore, the first comparative example has a problem that the delay line 112 wastefully consumes a larger amount of power.

Figure 7A:
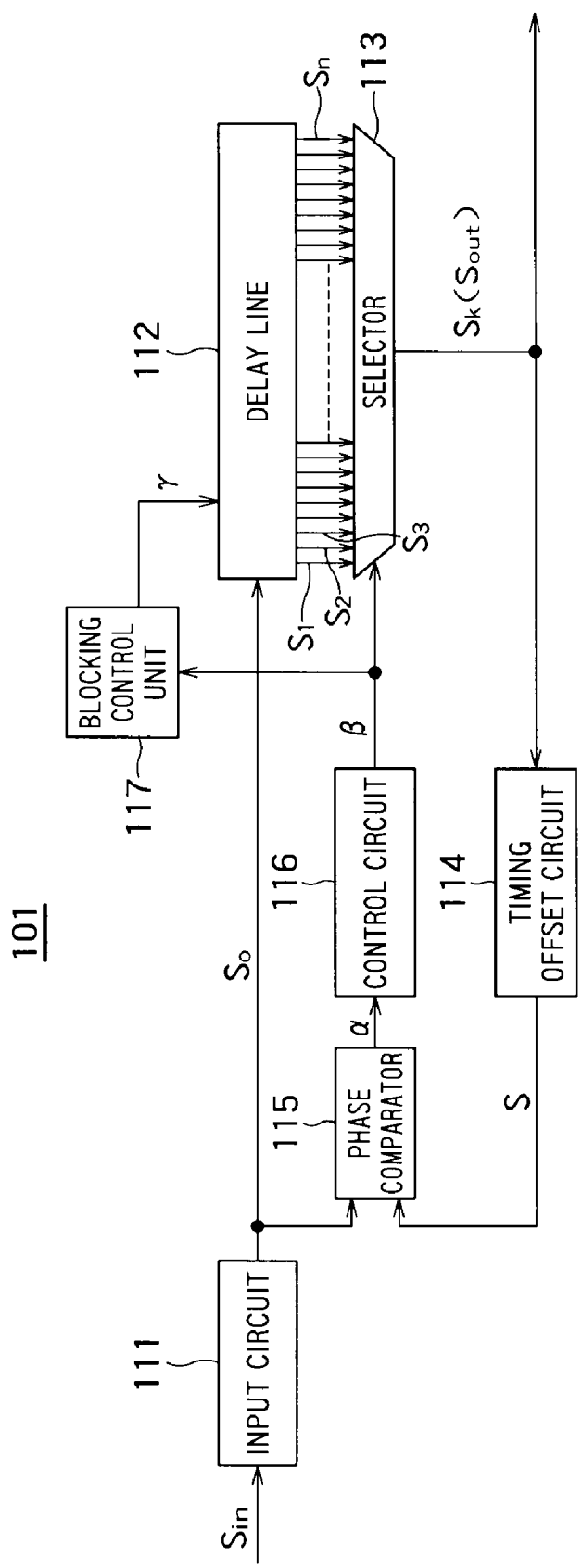
FIG. 7A shows a circuit configuration of a DLL circuit in a second comparative example.
Figure 7B:
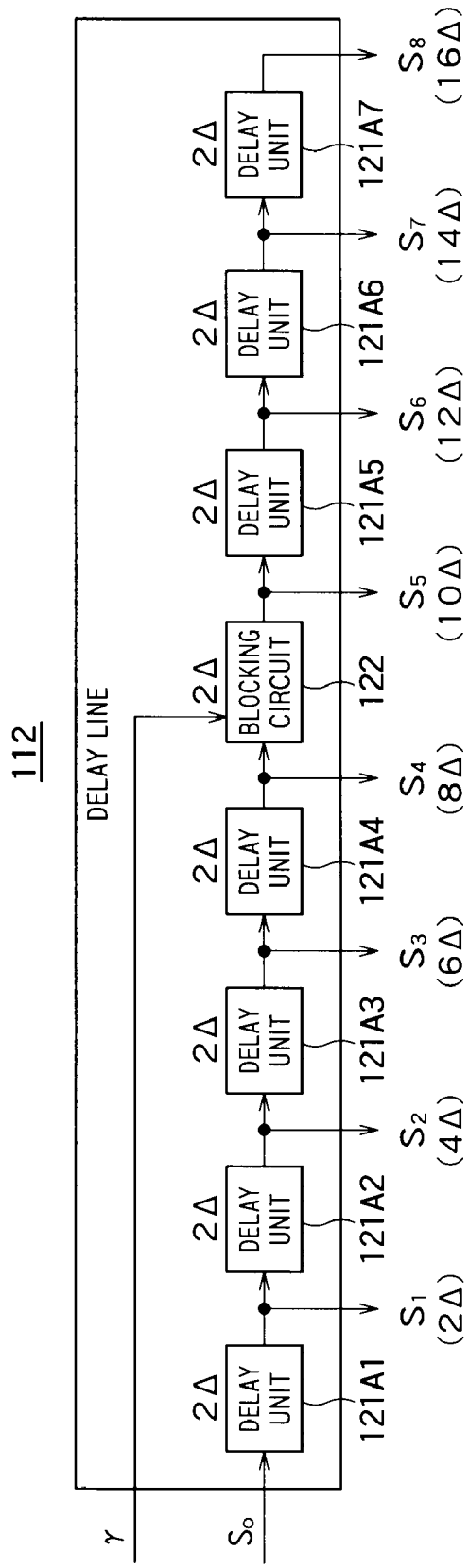
FIG. 7B shows a circuit configuration of a delay line shown in FIG. 7A.

FIG. 7A shows a circuit configuration of a DLL circuit 101 according to the second comparative example. The DLL circuit 101 includes an input circuit 111, a delay line 112, a selector 113, a timing offset circuit 114, a phase comparator 115, a control circuit 116, and a blocking control circuit 117. FIG. 7B shows a circuit configuration of the delay line 112 shown in FIG. 7A. The delay line 112 includes seven delay units 121A1 to 121A7 connected in series with each other, and a blocking circuit 122 inserted between the delay units 121A1 to 121A7.

Figure 7C:
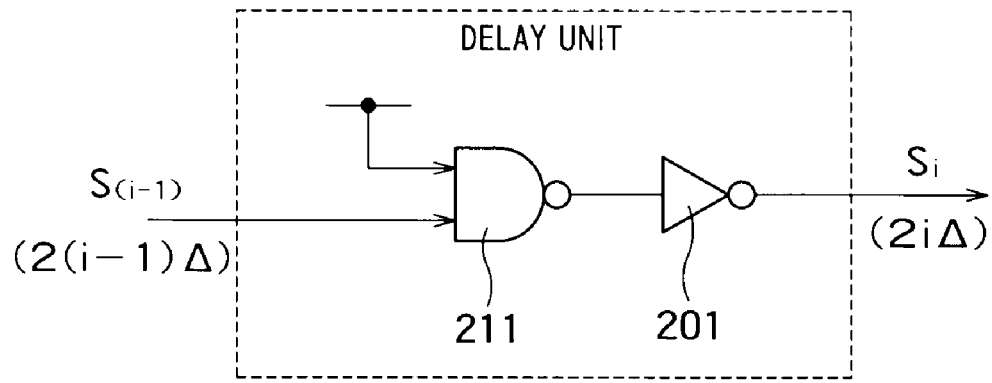
FIG. 7C shows a circuit configuration of each delay unit shown in FIG. 7B.
Figure 7D:
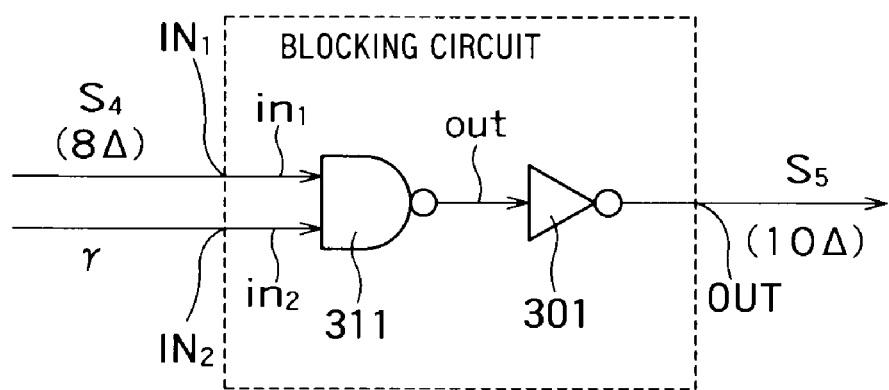
FIG. 7D shows a circuit configuration of a blocking circuit shown in FIG. 7B.

FIG. 7C shows a circuit configuration of each delay unit 121 shown in FIG. 7B. The delay unit 121 in FIG. 7C includes one inverter 201, and a NAND circuit 211 connected in series with the inverter 201. FIG. 7D shows a circuit configuration of the blocking circuit 122 shown in FIG. 7B. The blocking circuit 122 in FIG. 7D includes, similar to the delay unit 121 in FIG. 7C, one inverter 301, and a NAND circuit 311 connected in series with the inverter 301.

The DLL circuit 101 in the second comparative example includes the blocking circuit 122 and blocking control circuit 117. Accordingly, wasted power on the delay line 112 is reduced in the second comparative example. However, the delay time of each delay unit 121 is increased in order to enable the blocking circuit 122 to serve as a delay unit 121. Accordingly, the delay time of each delay unit 121 constituting the delay line 112 is 2*Δ in the second comparative example. Consequently, the DLL circuit 101 in the second comparative example has a problem that a large amount of jitter occurs in the DLL circuit 101.

Next, the present embodiment will be described.

The DLL circuit 101 according to the present embodiment includes a blocking circuit 122 and a blocking control circuit 117. Accordingly, part or all of wasteful power consumption is eliminated and wasted power on the delay line 112 is reduced in the present embodiment. Furthermore, the DLL circuit 101 of the present embodiment includes, in addition to plural delay units 121A connected in series with the blocking circuit 122, one or more delay units 121B connected in parallel with the blocking circuit 122. Therefore, the delay time of each delay unit 121 does not need to be equalized with the delay time of the blocking circuit 122 in the present embodiment. Accordingly, the delay time of each delay unit 121 constituting the delay line 112 is Δ, and the delay time of the blocking circuit 122 is 2*Δ, in the present embodiment. Consequently, the amount of jitter in the DLL circuit 101 in the present embodiment is about the same as that of the jitter in the DLL circuit in the first comparative example, and smaller than that of the jitter in the DLL circuit in the second comparative example. In this way, according to the present embodiment, wasted power as well as jitter can be reduced.

Generally, the percentage of power consumption on a delay line to the power consumption in a DLL circuit is approximately 25 to 40%. According to the present embodiment, waste of power consumption of as large as 25 to 40% can be reduced. The extent to which the power consumption on the delay line 112 can be reduced depends on factors such as the configuration of the DLL circuit 101, position in which a blocking circuit 122 is inserted, the number of blocking circuits 122 inserted, and the frequency of a reference signal $S_0$. Therefore, a nearly 95% reduction in power consumption on a delay line 112 may be achieved in some cases, and little reduction may be achieved in other cases. Under typical use conditions, however, it is thought that the reduction of approximately 50% can be achieved.

As has been described, according to embodiments of the present invention, there is provided an effective circuit configuration of a DLL circuit including a delay line.

The invention claimed is:

1. A DLL circuit comprising:
   a delay line configured to output a plurality of delayed signals of a reference signal, the delay line including,
      a plurality of first delay units connected in series with each other, each of the first delay units being configured to output a delayed signal of the reference signal,
      a blocking circuit inserted between a first and second of the plurality of first delay units, the blocking circuit being capable of switching between passing and blocking an input delayed signal of the reference signal, and the delay time of the blocking circuit being integer times as large as each of the delay time of the first delay units, and
      one or more second delay units connected in parallel with the blocking circuit, the same signal as the delayed signal that is input in the blocking circuit being input in the second delay units, each of the second delay units being configured to output a delayed signal of the reference signal, and the delay time of each of the second delay units being equal to the delay time of each of the first delay units; and
   a blocking control circuit configured to control the blocking circuit whether to pass or block the delayed signal that is input in the blocking circuit.

2. The DLL circuit according to claim 1, wherein, when a delayed signal that is output from a stage subsequent to the blocking circuit is used, the blocking control circuit causes the blocking circuit to pass the delayed signal, and
   when a delayed signal that is output from a stage subsequent to the blocking circuit is not used, the blocking control circuit causes the blocking circuit to block the delayed signal.

3. The DLL circuit according to claim 1, wherein the blocking control circuit generates a blocking control signal for controlling the blocking circuit, to control whether the blocking circuit to pass or block the delayed signal.

4. The DLL circuit according to claim 3, wherein, when the delay line receives the blocking control signal that instructs to pass the delayed signal, the delay line outputs delayed signals output from a stage preceding the blocking circuit and delayed signals output from a stage subsequent to the blocking circuit, and
   when the delay line receives the blocking control signal that instructs to block the delayed signal, the delay line outputs delayed signals output from a stage preceding the blocking circuit and does not outputs delayed signals output from a stage subsequent to the blocking circuit.

5. The DLL circuit according to claim 3, wherein the blocking circuit includes an AND circuit in which the delayed signal and the blocking control signal are input.

6. The DLL circuit according to claim 3, wherein the blocking circuit includes a NAND circuit in which the delayed signal and the blocking control signal are input.

7. The DLL circuit according to claim 1, wherein,
   in passing, the blocking circuit outputs the delayed signal, in such a manner that a delayed signal of a signal input from a preceding stage is output to a subsequent stage, and
   in blocking, the blocking circuit blocks the delayed signal, by blocking a signal input from a preceding stage.

8. The DLL circuit according to claim 1, wherein the one or more second delay units are connected in series with each other, when the one or more second delay units include a plurality of second delay units.

9. The DLL circuit according to claim 1, wherein the delay time of the blocking circuit is M times as large as the delay time of each of the first delay units, where M is an integer, and M delay units are connected in parallel with the blocking circuit as the second delay units.

10. The DLL circuit according to claim 1, wherein the delay time of the blocking circuit is equal to the total delay time of the second delay units.

11. The DLL circuit according to claim 1, wherein each of the first and second delay units includes an even number of inverters connected in series with each other.

12. The DLL circuit according to claim 1, wherein the blocking circuit includes an even number of inverters connected in series with each other and an AND circuit connected in series with the even number of inverters.

13. The DLL circuit according to claim 1, wherein the blocking circuit includes an odd number of inverters connected in series with each other and a NAND circuit connected in series with the odd number of inverters.

14. A DLL circuit comprising:
   an input circuit configured to generate, from a DLL input signal, a reference signal to be used for phase comparison;
   a delay line configured to output a plurality of delayed signals of the reference signal, the delay line including,
      a plurality of first delay units connected in series with each other, each of the first delay units being configured to output a delayed signal of the reference signal,
      a blocking circuit inserted between a first and a second of the plurality of first delay units, the blocking circuit being capable of switching between passing and blocking an input delayed signal of the reference signal, and the delay time of the blocking circuit being integer times as large as each of the delay time of the first delay units, and
      one or more second delay units connected in parallel with the blocking circuit, the same signal as the delayed signal that is input in the blocking circuit being input in the second delay units, each of the second delay units being configured to output a delayed signal of the reference signal, and the delay time of each of the second delay units being equal to the delay time of each of the first delay units;

a selector configured to select, from the plurality of delayed signals of the reference signal, a delayed signal to be used as a DLL output signal;

a timing offset circuit configured to adjust the phase of the selected delayed signal to generate a compared signal whose phase is to be compared with the phase of the reference signal;

a phase comparator configured to compare the phase of the compared signal with the phase of the reference signal to output a phase comparison result;

a control circuit configured to generate, based on the phase comparison result, a control signal for the selector; and a blocking control circuit configured to control, based on the control signal, whether the blocking circuit to pass or block the delayed signal that is input in the blocking circuit.

15. The DLL circuit according to claim 14, wherein,
when a delayed signal that is output from a stage subsequent to the blocking circuit is used, the blocking control circuit causes the blocking circuit to pass the delayed signal, and
when a delayed signal that is output from a stage subsequent to the blocking circuit is not used, the blocking control circuit causes the blocking circuit to block the delayed signal.

16. The DLL circuit according to claim 14, wherein the blocking control circuit generates a blocking control signal for controlling the blocking circuit, to control whether the blocking circuit to pass or block the delayed signal.

17. The DLL circuit according to claim 16, wherein,
when the delay line receives the blocking control signal that instructs to pass the delayed signal, the delay line outputs delayed signals output from a stage preceding the blocking circuit and delayed signals output from a stage subsequent to the blocking circuit, and
when the delay line receives the blocking control signal that instructs to block the delayed signal, the delay line outputs delayed signals output from a stage preceding the blocking circuit and does not outputs delayed signals output from a stage subsequent to the blocking circuit.

18. The DLL circuit according to claim 14, wherein,
in passing, the blocking circuit outputs the delayed signal, in such a manner that a delayed signal of a signal input from a preceding stage is output to a subsequent stage, and
in blocking, the blocking circuit blocks the delayed signal, by blocking a signal input from a preceding stage.

19. The DLL circuit according to claim 14, wherein,
when the delay of the compared signal is excessively large, the control circuit generates the control signal that causes the selector to select a delayed signal with a smaller delay, and
when the delay of the compared signal is excessively small, the control circuit generates the control signal that causes the selector to select a delayed signal with a lager delay.

20. A DLL circuit comprising:
a delay line configured to output a plurality of delayed signals of a reference signal, the delay line including,
a plurality of first delay units connected in series with each other, each of the first delay units being configured to output a delayed signal of the reference signal,
a plurality of blocking circuits, each of the blocking circuits being inserted between any two respective ones of the plurality of first delay units, each of the blocking circuits being capable of switching between passing and blocking an input delayed signal of the reference signal, and the delay time of each of the blocking circuits being integer times as large as the delay time of each of the first delay units, and
a plurality of second delay units, each of the second delay units being connected in parallel with any of the blocking circuits, the same signal as the delayed signals that are input in the blocking circuits being input in the second delay units, each of the second delay units being configured to output a delayed signal of the reference signal, and the delay time of each of the second delay units being equal to the delay time of each of the first delay units; and
a blocking control circuit configured to control the blocking circuits whether to pass or block the delayed signals that are input in the blocking circuits.

* * * * *